(12) United States Patent
Meyer (10) Patent No.: US 8,390,107 B2
(45) Date of Patent: Mar. 5, 2013

(54) SEMICONDUCTOR DEVICE AND METHODS OF MANUFACTURING SEMICONDUCTOR DEVICES

(75) Inventor: Thorsten Meyer, Regensburg (DE)

(73) Assignee: Intel Mobile Communications GmbH, Neubiberg (DE)

( * ) Notice: Subject to any disclaimer, the term of this patent is extended or adjusted under 35 U.S.C. 154(b) by 287 days.

(21) Appl. No.: 11/863,290

(22) Filed: Sep. 28, 2007

(65) Prior Publication Data

US 2009/0085186 A1  Apr. 2, 2009

(51) Int. Cl.
*H01L 23/06* (2006.01)

(52) U.S. Cl. .................. 257/684; 257/778; 257/779

(58) Field of Classification Search .................. 257/684, 257/779, 778, E23.023, 787, E23.131, 690, 257/E23.069, 667, E23.116, E23.128, E23.132
See application file for complete search history.

(56) References Cited

U.S. PATENT DOCUMENTS

| | | | |
|---|---|---|---|
| 5,608,265 A * | 3/1997 | Kitano et al. | 257/738 |
| 6,308,938 B1 * | 10/2001 | Futakuchi | 257/780 |
| 6,355,975 B2 * | 3/2002 | Miyazaki et al. | 257/668 |
| 6,365,980 B1 * | 4/2002 | Carter et al. | 257/787 |
| 6,518,675 B2 | 2/2003 | Kim et al. | |
| 6,946,325 B2 * | 9/2005 | Yean et al. | 438/112 |
| 7,208,825 B2 * | 4/2007 | Pu et al. | 257/686 |
| 7,268,067 B2 * | 9/2007 | Hall et al. | 438/617 |
| 2002/0070437 A1 | 6/2002 | Heerman | |
| 2005/0151269 A1 | 7/2005 | Song et al. | |
| 2005/0173788 A1 * | 8/2005 | Cher'Khng et al. | 257/678 |
| 2007/0045845 A1 | 3/2007 | Lal et al. | |

FOREIGN PATENT DOCUMENTS

DE  102006001429 A1  3/2007

OTHER PUBLICATIONS

Brunnbauer et al., "Embedded Wafer Level Ball Grid Array (eWLB)", 2006 Electronics Packaging Technology Conference, ©2006 IEEE, (5 pages).

* cited by examiner

*Primary Examiner* — Steven Loke
*Assistant Examiner* — Kimberly M Thomas
(74) *Attorney, Agent, or Firm* — SpryIP, LLC (57) ABSTRACT

This application relates to a semiconductor device comprising a semiconductor chip, a molded body covering the semiconductor chip, wherein the molded body comprises an array of molded structure elements, and first solder elements engaged with the molded structure elements.

12 Claims, 11 Drawing Sheets

SEMICONDUCTOR DEVICE AND METHODS OF MANUFACTURING SEMICONDUCTOR DEVICES

BACKGROUND

The present invention relates to a semiconductor device and methods of manufacturing semiconductor devices.

In the wake of an ever increasing level of function integration in semiconductor devices, the number of input/output channels of semiconductor devices has been rising continuously. At the same time, there is a demand to shorten signal channel lengths for high frequency applications, to improve heat dissipation, improve robustness, and to decrease manufacturing costs.

The introduction of Ball Grid Arrays (BGA) and other array connect technologies in the last 20 years has since helped the semiconductor packaging industry to meet many of the demands. Still, for this and other reasons, there is an ongoing effort to improve the array connect technologies.

SUMMARY

Accordingly, there is provided a semiconductor device comprising a semiconductor chip, a molded body covering the semiconductor chip and being shaped to comprise an array of molded structure elements on a first face of the molded body, and first solder elements connected to the molded structure elements.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Although specific embodiments have been illustrated and described herein, it will be appreciated by those of ordinary skill in the art that a variety of alternate and/or equivalent implementations may be substituted for the specific embodiments shown and described without departing from the scope of the present invention. For example, while the embodiments mention either recesses or protrusions as means for engaging a solder element with a molded body, the means for engaging a solder element with a molded body may also be multiple recesses, multiple protrusions, or a combination of recesses and protrusions. Also, for example, while most embodiments refer to axially symmetric recesses or protrusions, the recesses and protrusions may also be axially asymmetric, e.g., be trenches in the molded body, webs on the molded body, or the like. Generally, this application is intended to cover any adaptations or variations of the specific embodiments discussed herein. Therefore, it is intended that this invention be limited only by the claims and the equivalents thereof.

Figure 1A:
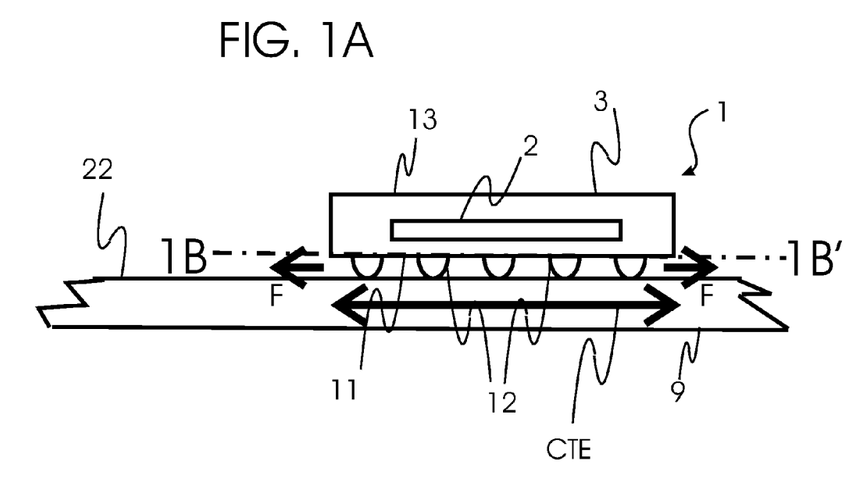
FIGS. 1A and 1B schematically disclose two views of cross sections of a semiconductor device soldered to a printed circuit board along the axes 1A-1A' and 1B-1B'.
Figure 1B:
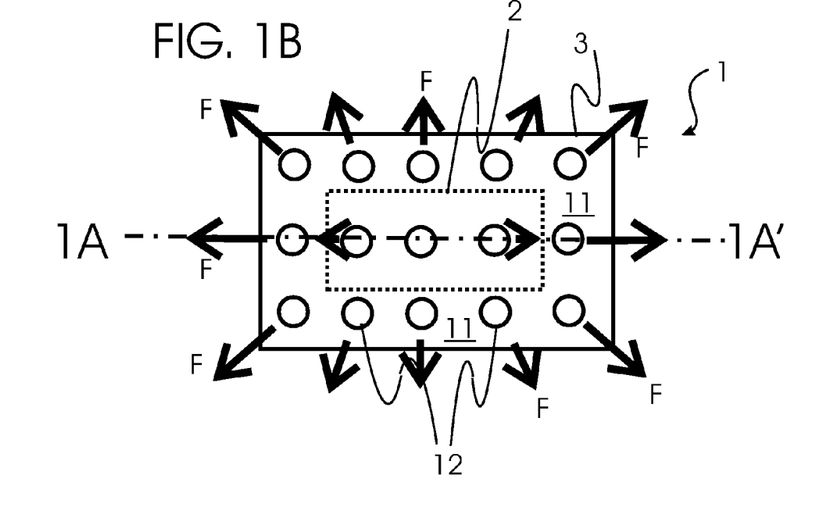

FIGS. 1A and 1B schematically display views on two orthogonal cross sections along the axes 1A-1A' and 1B-1B' through an electronic system consisting of a semiconductor device 1 soldered to a printed circuit board 9 (PCB) via an array of solder elements 12. As can be seen, semiconductor device 1 is comprised of a semiconductor chip 2 that is packaged in a molded body 3, and a two-dimensional array of solder elements 12 that protrude from a first surface 11 of molded body 3 and connect the semiconductor device 1 to the printed circuit board 9 on assembly plane 22 (first plane). Typically, the molded body 3 is shaped to be roughly of cubical shape having the planar first surface 11 (first face) facing the printed circuit board 9. The molded body 3 further comprises a second surface 13 (second face) facing away from the printed circuit board 9, and side faces connecting first and second surfaces 11, 13. The two-dimensional array of solder elements 12 is attached to the planar first surface 11 of molded body 3. The use of a two-dimensional array of solder elements on the first surface 11 facilitates a high input/output channel density.

The array of solder elements 12 on the first surface 11 of the molded body 3 may serve two purposes: (a) if the solder elements 12 are electronically connected to the integrated circuit in the semiconductor chip 2, the solder elements 12 may provide the electrical connection between the integrated circuit and the circuit on the PCB 9, and (b) the array of solder elements 12 provides a mechanically connection for rigidly holding the semiconductor device 1 to the printed circuit board 9.

FIGS. 1A and 1B also disclose mechanical forces, indicated by the arrows F, that act on the solder elements 12 when printed circuit board 9 expands laterally at a higher rate than the semiconductor device 1 due to deviating coefficients of thermal expansion (CTE) of the materials involved. For example, the CTE of silicon is only $3 \times 10^{-6}$ 1/K while the CTE of a PCB is in the range of $17 \times 10^{-6}$ 1/K. Due to the CTE differences, temperature cycles of the semiconductor device during manufacturing or device operation may generate shear forces on the solder elements that may break the solder elements from the molded body 3, which may cause the devices to fail. The lateral expansion of PCB 9 in FIG. 1A due to heat-up of the system is indicated by a double-arrow labeled CTE. The lateral expansion of the PCB, most of all, generates shear forces on the solder elements 12. Of course, when cooling down the electronic system, the shear forces F act in reverse directions.

FIG. 1B, the various lengths of the arrows of the various solder elements 12 indicate that the shear forces F are the larger the further away a solder element is located away from the central solder elements. This observation indicates that the risk of solder elements breakage is the larger the larger the area of the solder element array is. Further, the risk of solder element breakage is highest for those solder elements that are located at the outer edges of the solder element array.

Figure 2A:
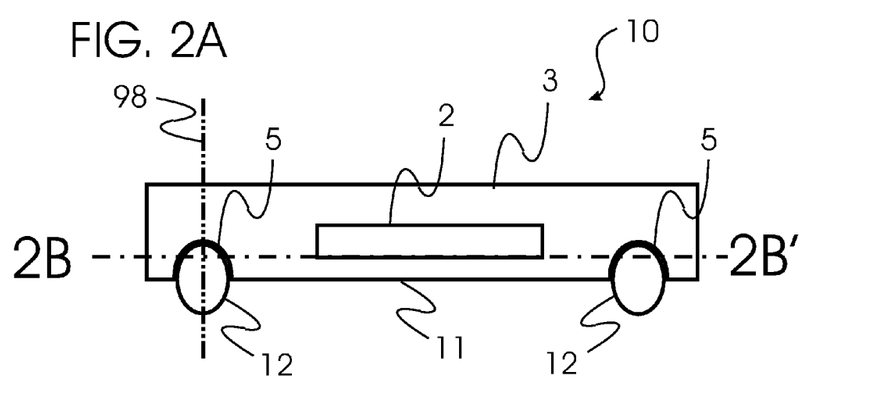
FIGS. 2A and 2B schematically disclose two orthogonal cross sections of an embodiment of a semiconductor device comprising a molded body shaped to comprise an array of recesses in the molded body, and first solder elements in the recesses.
Figure 2B:
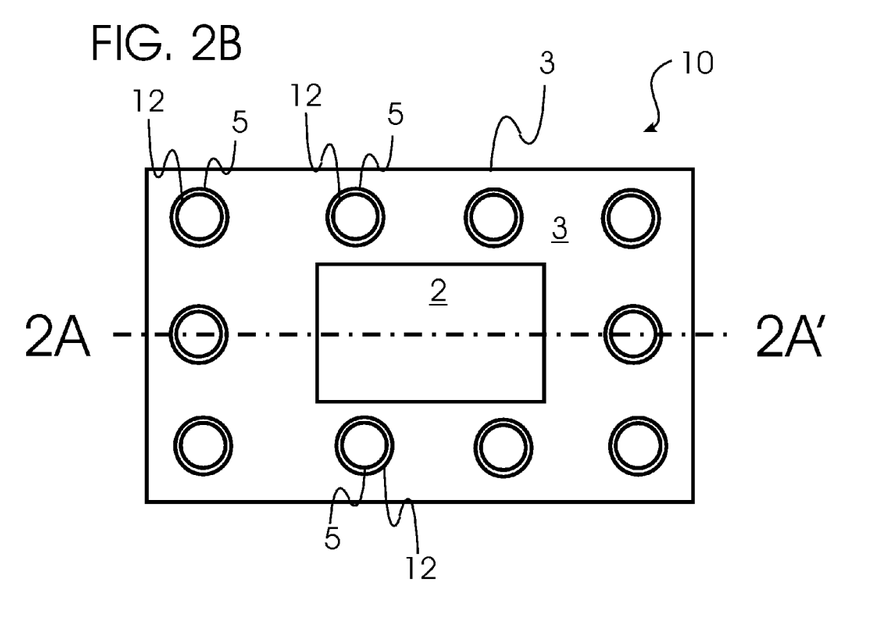

FIGS. 2A and 2B schematically disclose views on two orthogonal cross sections along the axes 2A-2A' and 2B-2B' of an embodiment of a semiconductor device 10 comprising a semiconductor chip 2, a molded body 3 that encapsulates the semiconductor chip 2, an array of recesses 5 (array of molded structure elements) formed in a first surface 11 (first face) of the molded body 3, and first solder elements 12 engaged with the recesses 5.

In this embodiment, the array of molded structure elements 5 comprises recesses formed in the molded body 3, i.e. molded body 3 and molded structure elements 12 are made of one piece and of the same material. With the recesses 5 in the molded body 3, a mechanical engagement of the solder elements 12 with the molded body 3 can be provided to withstand lateral forces acting on the solder elements 12 along assembly plane 22 directions. The recesses 5 may be generated, e.g., by using a mold form with an array of protrusions on its inner wall that form predetermined recesses in the molded body during the molding of the molded body 3. Alternatively, the recesses 5 may be formed after the molding, e.g. by selectively etching the recesses, by laser drilling, by mechanical drilling, or by any other method appropriate for generating recesses into the molded body material.

In FIGS. 2A and 2B, the first solder elements 12 fully fill the volumes of their respective recesses 5. Further, solder elements 12 and recesses 5 are each axially symmetric and coaxially aligned with respect to a solder element axis 98 that is orthogonal to the first surface 11 of molded body 3. With the solder element axis 98 orthogonal to the first surface 11, the recesses 5 in molded body 3 and solder elements 12 are mechanically engaged with respect to forces in all lateral directions equally. In this case, for example, the engagement of solder elements 12 with the recesses 5 can withstand a lateral CTE induced shear force F equally well during cooling the semiconductor device as it can do during heating up the device. In both cases, the lateral shear forces acting on the solder elements 12 can be partially transferred to the inner walls of the recesses. This relieves the strain from the interface between solder element 12 and molded body 3. Further, with the solder elements 12 fully filling the recesses 5, the recesses 5 and the solder elements 12 have large common interface areas that provide good adhesion between the recess surfaces and the solder element surfaces.

The solder elements 12 in FIGS. 2A and 2B may be used to solder the semiconductor device to a carrier, e.g. to a printed circuit board. This way, the solder elements 12 rigidly hold and, possibly, electrically connect the semiconductor device 10 to the PCB board. Typically, the solder elements 12 protrude from first face 11 of the molded body 3 in a bump-like shape. The solder elements 12 may be, for example, solder balls or solder bumps. Generally, the solder elements 12 of a given semiconductor device 10 have the same shape with diameters between, typically, 50-500 micrometers, depending on the pitch and the package size. For a pitch of 0.5 mm typically a ball diameter of 300 μm is used. The solder elements 12 are typically sized and aligned to define an assembly plane 22 (first plane) that determines the orientation and location of the semiconductor device with respect to a carrier to which the semiconductor device 10 is soldered. In order to have the mechanical engagement between the molded body 3 and the solder elements 12 effective, at least 10 percent of the solder elements may be inside of the recess volume.

The solder elements may be made of any solderable material. The solderable material may be one of the well-known tin-lead solders that can be soldered at a temperature between 180-190° C. Alternatively, the solderable material may be any of the known lead-free solders containing, e.g., tin, copper, silver, bismuth, indium, zinc, antimony and other metals in various amounts. Further, optional, the solderable material may also be hard solder material, like copper-zinc or copper-silver alloys.

Typically, before applying the solder elements 12 to the recesses 5, the inside wall of the recesses 5 is covered with a first conducting layer (not shown in FIGS. 2A-2B) that facilitates the application of the solder elements 12 into the recesses 5. The first conducting layer may be structured to provide one or multiple conducting lines that electrically connect the solder elements 12 with the silicon chip 2. The first conducting layer may be a redistribution layer, or be part of a redistribution layer. The first conducting layer may be made of the redistribution material (e.g. Cu), or it may contain additional metal layers, e.g., an "Under Bump Metallization" (UBM) layer that may consist of a conductive base layer (e.g. Cu), a barrier layer (e.g. Ni, NiV, Cr, Ti or TiW), and/or an oxidation barrier layer (e.g. Au, Pd). The UBM layers in the recesses 5 may further be electrically connected to the semiconductor chip 2 in various ways. This way, the solder elements are electrically connected to the semiconductor chip 2.

Semiconductor chip 2 may contain an integrated circuit, a sensor, a micro-electromechanical system (MEMS), optical components or any other functional device that is integrated into the semiconductor chip. Typically, the semiconductor chip 2 has a thickness of a few hundred micrometers and a lateral extension of a few millimeters, or centimeters, in lateral directions (see FIG. 2B).

As can be seen from FIGS. 2A and 2B, semiconductor chip 2 is fully encapsulated by molded body 3. Encapsulating semiconductor chips in a molded body helps protecting the sensitive surfaces of the chip from harming environmental influences, like humidity, scratches and chemicals. In one embodiment, as will be explained later in more detail, molded body 3 has been formed from hot liquid mold material that has been introduced under pressure into a mold in which the chip 2 was inserted. During cooling, the mold material hardens to take on the shape of the mold form.

In the case of FIGS. 2A and 2B, molded body 3 is a cubical with an array of four columns of recesses 5 on its first surface 11. Note that the term "array of recesses" may also refer to two-dimensional arrays that have missing elements therein, like in this example where the second and the third columns consist of only two solder elements 12 instead of four. In FIGS. 2A and 2B, first surface 11 is a flat surface that provides sufficient space for placing the two-dimensional array of first solder elements 12 thereon.

The mold material may be a polymer, e.g. an epoxy resin that, for CTE-adjustment, may contain a filling material, e.g. silicon oxide, and other components, like organic hardeners, release agents, adhesion promoters, flame retardants, thermally conductive fillers, electrically conductive fillers etc. The choice of the right mold material mixture, and the details of the molding process, depend on the application and are well known in the art.

It should be noted that the term "recess" may stand for many different types of recesses. They may be holes, cavities, trenches, depressions, openings, or through-holes that reach from one face 11 of the molded body 3 to the opposite other face 3 of molded body 3. In FIGS. 2A and 2B, the depth of the recesses 5 is in the range of the diameters of the solder elements 12, e.g. 50 to 500 micrometers, depending on the application.

The size of the recesses may also depend on the size of the semiconductor device. For large packages, for example for molded bodies larger than, say, 50 squared millimeters for a pitch of 0.5 mm, the lateral forces acting on the outer solder elements during a temperature cycle may require larger recesses and larger solder bumps in order to be withstand the lateral forces generated by a CTE mismatch.

Figure 3A:
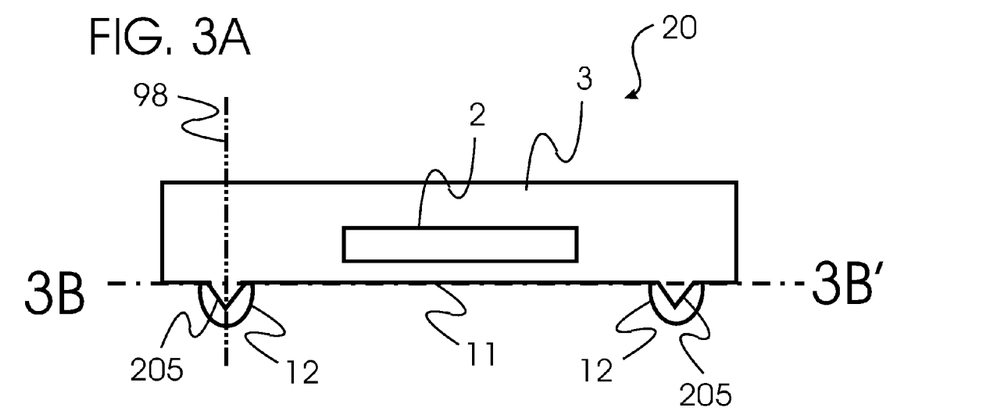
FIGS. 3A and 3B schematically disclose two orthogonal cross sections of an embodiment of a semiconductor device comprising a molded body shaped to comprise an array of protrusions, and first solder elements enclosing the protrusions.
Figure 3B:
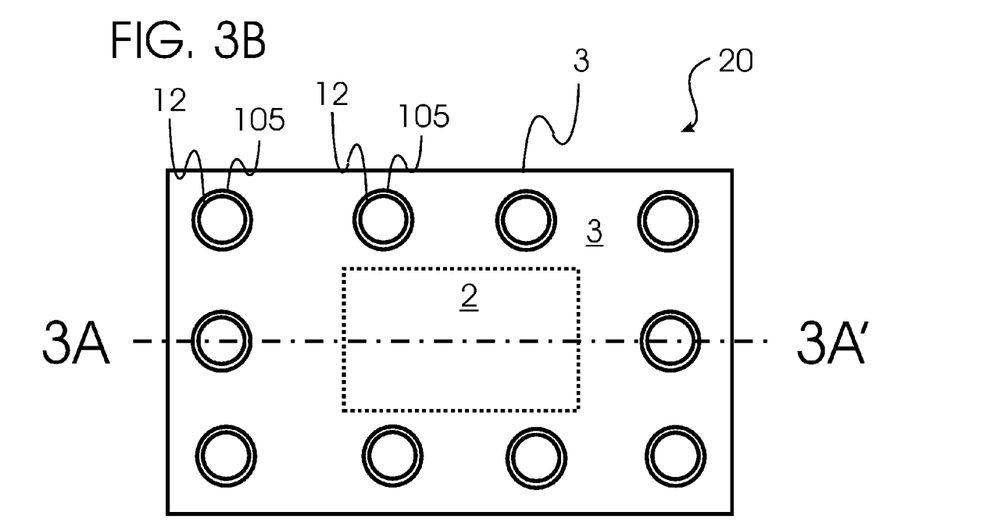

FIGS. 3A and 3B disclose a further embodiment of a semiconductor device 20 that in many ways resembles the embodiment of FIGS. 2A and 2B. Elements in FIGS. 3A-3B and 2A-2B with identical reference numbers may refer to the same features. Different to FIGS. 2A and 2B, the array of molded structure elements consists of protrusions 205 made of molded material that protrude from first face 11 of molded body 3. Molded body 3 and molded structure elements 12 are made of one piece and of the same material. The protrusions 205 made of molded material make sure that the solder elements 12 and the molded structure elements 205 are engaged to resist lateral forces that may arise during temperature cycles or external other forces.

Like in FIGS. 2A-2B, each of the solder elements 12 and recesses 5 is rotationally symmetric to a solder element axis 98 that is orthogonally oriented with respect to the first surface 11. This way, the solder elements 12 are mechanically engaged with the molded body 3 with respect to all lateral forces acting on the solder elements 12.

Protrusions may be generated during molding of the molded body 3, e.g. by having a wall of the mold form equipped with recesses that, as a counterpart of the molded body 3, form respective protrusions on the first face 11 during the molding process of the molded body 3. The size of the protrusion 205 depends on the application and the expected lateral forces during manufacturing and device operation. The size of the protrusions 205 depends on the size of the solder elements 12. For example, if the diameter of the solder elements 12 is of the order of 1000 micrometers, the size of the protruding elements may be half the size. Generally more than one protrusion per interconnect element can be used as well.

Figure 4A:
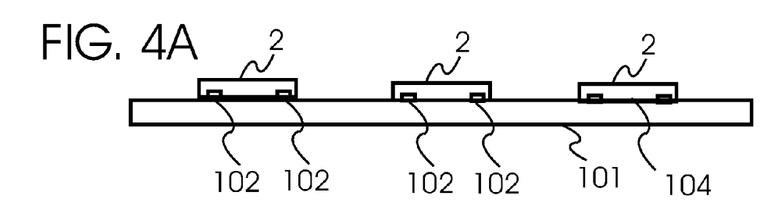
FIGS. 4A to 4H schematically disclose an embodiment of a method of manufacturing semiconductor devices wherein recesses are formed after molding of the molded body.

FIGS. 4A to 4H disclose schematically an embodiment of a method of manufacturing semiconductor devices 30. Elements in FIGS. 4A-4H, 2A-2B and 3A-3B with identical reference numbers may refer to the same features. FIG. 4A discloses a carrier 101 onto which semiconductor chips 2 are placed. In principle, carrier 101 may be any structure that can be used as a basis for placing and molding semiconductor chips 2. For example, carrier 101 may be a bottom piece of a mold form, a foil on which the chips are positioned and molded, or a two-sided sticky tape with thermo-release properties.

For the present embodiment, we assume carrier 101 to be a double-sided sticky tape with thermo-release properties that is laminated onto a flat plate. The double-sided stickiness of the tape makes sure that the tape is securely held by the flat plate, and that the individual semiconductor chips 2 and elastic elements 14 can be securely placed onto predefined positions with high accuracy, e.g. with a spatial precision of about 10-15 micrometers (see FIG. 4A). Note that the individual chips 2 are placed onto the carrier 101 in an upside-down direction, i.e. the first main faces 104 of the chips 2 that comprise connection elements 102 (possibly the active region of the chip) are facing downwardly in a direction towards carrier 101. Usually, the chips 2 are taken from a processed and singulated wafer, picked by a pick-and-place automate, and placed on carrier 101 at predefined distances to each other. The larger the distance between adjacent chips 102 are that larger the package size of the individual semiconductor devices can be, as will be described later.

Figure 4B:
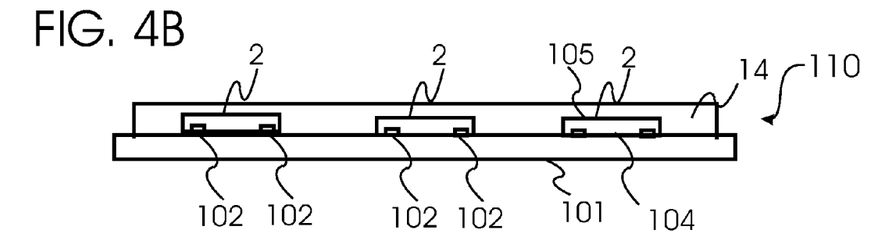

FIG. 4B schematically discloses the set-up of FIG. 4A after molding the semiconductor chips 2 with mold material in a compression molding process. In a compression molding process, a liquid molding compound, e.g. a polymer or resin, is dispensed over the semiconductor chips. Afterwards, a top cavity is moved downwardly towards the carrier to close the cavity, thereby spreading out the mold material until the cavity is completely filled. By cooling the mold material down to room temperature, the mold material hardens to become molded workpiece 110 comprised of the molded material and the multiple chips 2 to which the molded material adheres.

Generally, molded workpiece 110 may have any shape, e.g. that of a circular disc, a rectangular panel, etc. For the present embodiment, it is assumed that molded workpiece 110 has been shaped by a mold form with a cavity having a height and lateral extension of a standard semiconductor wafer. For example, the diameter may be 8 or 12 inches (200 mm or 300 mm), and the height may be typically 400 to 800 micrometers. With such size, workpiece 110 and the semiconductor chips 2 covered by the molded body 3 form a "reconstituted wafer" 160 on which, with standard wafer processing equipment, additional layers can be conveniently deposited and structured.

It should be noted that the molding can also be done by a more traditional method known as transfer molding, which is a widely used technique for the encapsulation of electronic devices. The principal of this technique is based on a thermally liquefied molding compound being transferred under pressure into a preformed cavity.

Figure 4C:
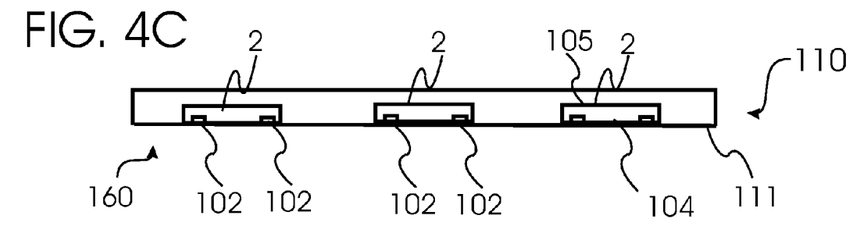

FIG. 4C schematically discloses reconstituted wafer 160 after separation from carrier 101. The separation may be conveniently carried out by heating the thermo-release tape. After release, the first main surfaces 104 of the semiconductor chips 2 and the connection elements 102 are exposed to the outside as no molded material is covering the three. Further, the exposed first main surfaces 104 of the semiconductor chips 2 and surface of the molded material form a flat coplanar plane 111.

Figure 4D:
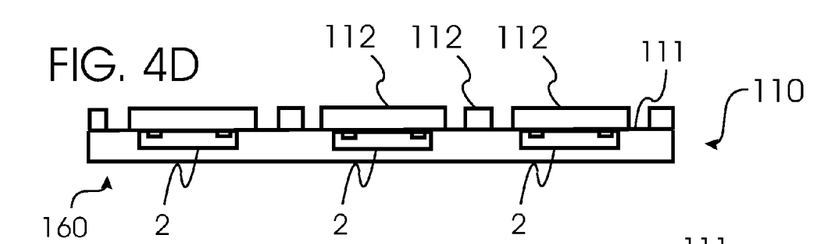

FIG. 4D schematically discloses reconstituted wafer 160 after it has been turned upside down, and after application of a mask 112 on coplanar plane 111 of reconstituted wafer 160. Mask 112 may be generated by standard photolithographic methods used in microelectronics, e.g. by applying a resist layer made of, e.g., PMMA over the reconstituted wafer 160, illuminating the resist selectively to a primary mask, and dissolving the illuminated regions of the resist layer away. Mask 112 covers the entire coplanar plane 111 except for openings in the regions where recesses 5 are to be etched into the molded material. The step of FIG. 4D would not be necessary, if the recesses are mechanically drilled, or drilled by laser.

Figure 4E:
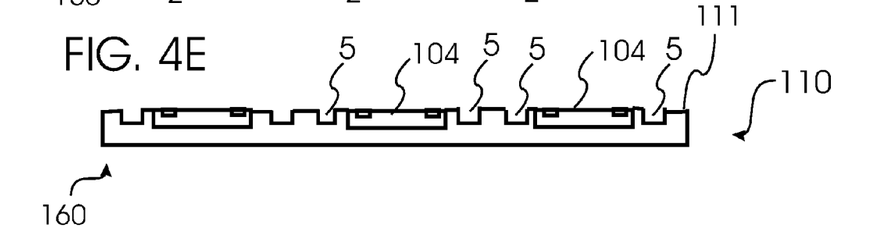

FIG. 4E schematically discloses reconstituted wafer 160 after etching the molded material selectively to mask 112, and after removal of mask 112. Etching may be carried out with suitable chemicals. The depth of the recess may be, for example, comparable to the 20-40% of the thickness of the chips 2, e.g. between 20 and 200 micrometers. The lateral area of the recesses depends on the sizes of the solder elements 12 that are to be engaged with the recesses 5. In the present embodiment, the diameters of the solder elements 12 are about two times as large as the lateral extension of recesses 5. For example, the lateral extension of the recesses may be in the range of 50-300 micrometers.

Figure 4F:
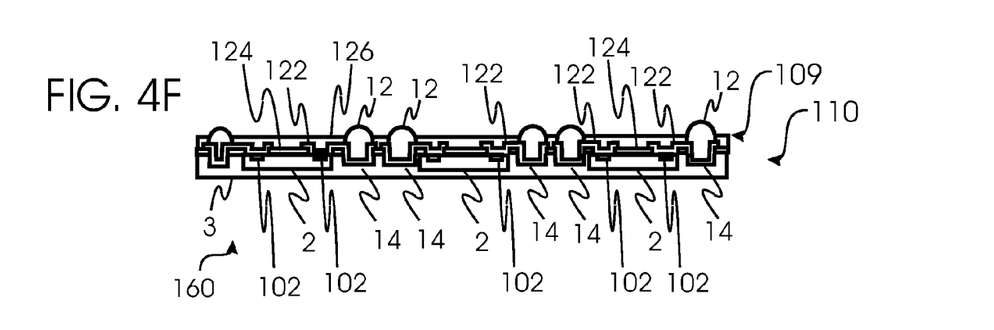

FIG. 4F schematically discloses reconstituted wafer 160 after his coplanar plane 111 has been covered with a redistribution layer 109 that electrically connects the connection elements 102 of the semiconductor chips 2 with respective solder elements 12. Further, above the recesses 5 on top of the redistribution layer 109, solder elements 12 are deposited. The deposition of solder elements 12 is well known in the art and, therefore, will not be explained here in more detail.

The redistribution layer in FIG. 4F is comprised of conducting lines 122 (first conducting layer) that provide for the electrical connections between the connection elements 102 and the solder bumps 12, elements of an insulation layer 124 that selectively insulate the surfaces of the semiconductor chips 2 from the conduction lines 122, and solder stop layer 126 for defining the solder element 12 positions. Conducting lines 122, the elements of the insulation layer 124, and solder stop layer 126 are each manufactured by disposing a layer of the respective material and structuring the layer photo-lithographically, one after the other. It is possible to extend the number of layers if necessary. For example for high input/output requirements, more than one conducting layer can be deposited in order to have two separate layers of conducting lines 122 for connecting the high number of input/output solder elements 12 with the connection elements 102 of the chips 2.

Figure 4G:
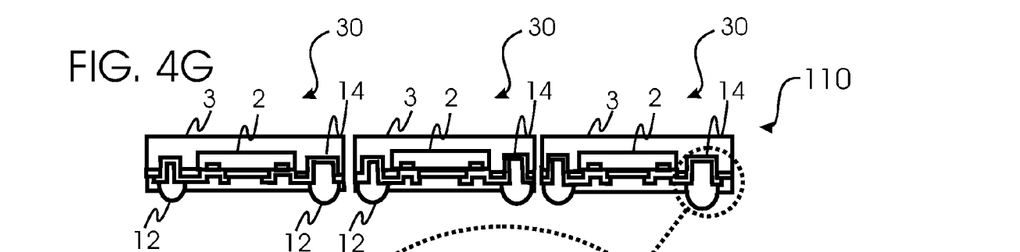

FIG. 4G schematically discloses reconstituted wafer 160 of FIG. 4F after singulation, i.e. after sawing, laser dicing or etching the mold material of reconstituted wafer 160 to obtain separate semiconductor devices 30 packaged in molded bodies 3. Singulation by sawing, laser dicing, or etching the mold material is a standard process well known in the art. Note that the sawing process is being performed after molding, and after application of the solder elements 12. This way, the molding process and the application of the solder element 12 can be carried out on wafer level, i.e. as a batch process, where many semiconductor devices can be manufactured in parallel.

Figure 4H:
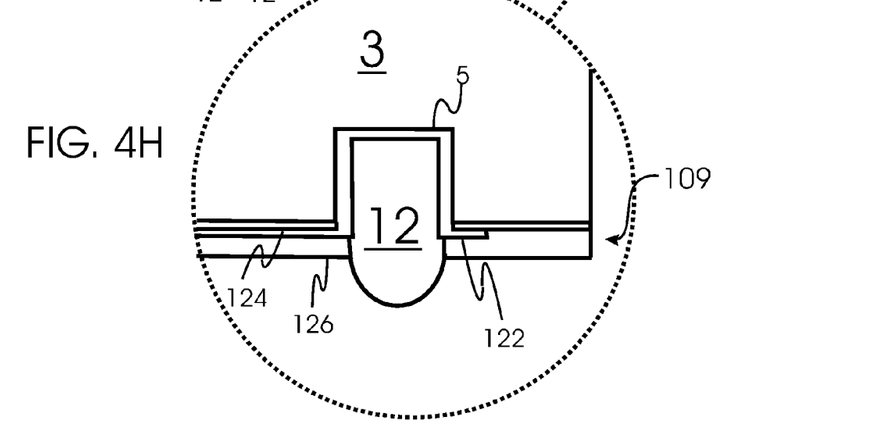

FIG. 4H discloses a section of the embodiment of FIG. 4G magnified to schematically illustrate the structure of the semiconductor device 30 of FIG. 4G in the vicinity of a recess 5 in more detail. FIG. 4H discloses redistribution layer 109 consisting of elements of insulation layer 124 applied over molded body 3 and silicon chip 2, conducting lines 122 applied over insulation layer 124 and the connection elements 102 of the silicon chip 2, and solder stop layer 126 applied over the insulation layer 124 and the conducting lines 122. Conducting lines 122 are deposited in a way that they completely cover the inner wall of the recesses 5. Covering the inner wall of the recesses completely makes sure that for producing the solder elements the solder material completely fills and adheres to the inner wall of the recess 5. If the inner wall of the recesses is only partially metallized, the solder material adheres to only the metallized region of the wall, e.g. the ground of the recesses.

The layers of the redistribution layer 109 have been applied on the wafer level, typically by using thin-film techniques, but printing or jetting technologies would be possible as well. Thin film techniques, by use of sputtering processes, spin-on processes, galvanization, vapor deposition, photolithography, etching, and other known processes, enable manufacturing of very fine structures on a wafer. Typically, the minimum structure size of insulation layer 124 may be as low as 10-20 micrometer (lateral size), while the thickness of the insulation layer 124 is in typically in the range of 5 to 15 micrometers. Materials that are used for the insulation materials are polymers, like polyimide, epoxies, BCB or PBOs or other known dielectric materials.

The conducting lines 122 (first conducting layer) have been sputtered and/or plated of a conducting material, e.g. aluminum, copper, or stacks of metals, e.g. CuNiAu. The thickness of the conducting lines is typically 1 to 7 micrometers. If the conducting lines 122 fully cover the recess 5 in the insulation layer 12, a good electric connection is made between the connection elements 102 of the semiconductor chips 2 and the respective solder elements 12. Further, with the conducting lines 122 fully covering the inner walls of the recesses 5, the conducting lines 122 form a base for building up the solder elements 12 during the following processing steps. As mentioned before, the conducting lines 122 can be used as "under bump metallization" (UBM). Alternatively, additional UBM-layers (not shown in FIG. 4H) may be applied over the base of the conducting lines 122 to prevent diffusion, oxidation and other chemical processes in the interface region of the solder elements 12 and the conducting lines 122. The UBM may consist just of a conducting layer, or of an adhesion layer, a conducting wetting layer, a diffusion barrier layer and a conducting oxidation barrier layer (not shown in FIG. 4H).

FIG. 4H further discloses solder stop layer 126, an insulating layer with openings over the recesses 5 for allowing solder material to enter into the recesses 5. Solder stop layer 126 may be of polymers, like polyimide, epoxies, BCB, PBOs or other known dielectric materials, having a thickness of typically a few micrometers. Solder stop layer 126 prevents solder material from expanding laterally over the surface of the redistribution layer when applying solder material, e.g. Pb/Sn, over the conducting lines.

FIG. 4H further discloses solder element 12 formed on top of conducting line 122 in and over the recess 5. Solder element 12 is co-aligned to recess 5, and fully fills recess 5. Due to the solder element fully filling the volume of recess 5, a strong mechanical engagement of the solder element 12 with the recess 5 with respect to lateral forces is provided.

FIGS. 5A to 5E schematically disclose a further embodiment of a method of manufacturing semiconductor devices 40. The method, in many ways, is similar to the embodiment of FIGS. 4A to 4H. Elements and features having the same reference numbers as the features of the previous figures may refer to similar features.

In FIGS. 5A to 5E, a carrier 201 with conically shaped protrusions 144 is shown. The conically shaped protrusions 144 form cone-shaped recesses in the molded material when applying mold material over the carrier (see FIG. 9B). The protrusions 144 may be part of the double-sided sticky thermo-releasable tape that was used in the description of FIGS. 4A-4H. In this case, it is easy to remove the molded workpiece 210 from the tape later despite the protrusions 144. In another embodiment, the protrusions 144 may be part of a mold form in which the semiconductor chips 2 are molded. Further, like in FIGS. 4A-4H, the chips 2 are placed on the carrier 201 at predetermined distances from each other. Further, likewise, the chips 2 are oriented such that the connection elements 102 face the carrier 201.

Figure 5A:
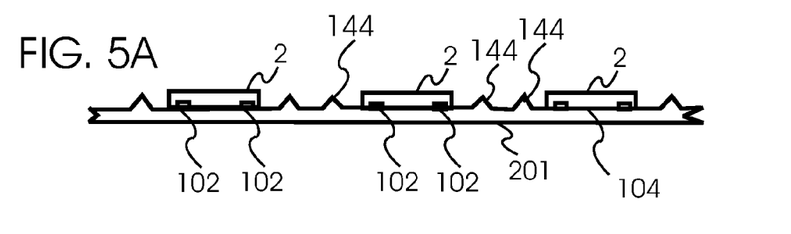
FIGS. 5A to 5E schematically disclose an embodiment of a method of manufacturing semiconductor devices wherein recesses are formed during the molding of the molded body.
Figure 5B:
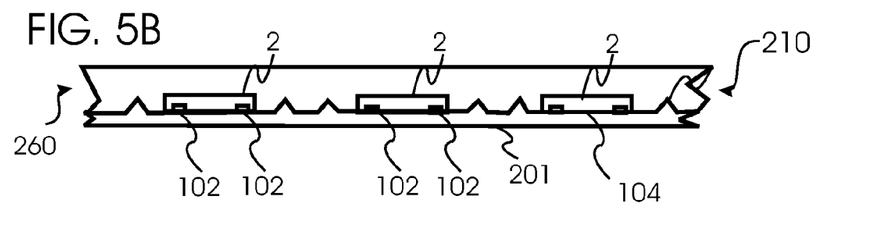

FIG. 5B schematically discloses the semiconductor chips 2 after having been molded to become a molded workpiece 210. Like in the previous embodiments, the mold form that forms the reconstituted wafer 260 is provided with a cavity of a semiconductor wafer shape, i.e. a height of typically a few hundred micrometers, and a diameter of, say, 200 mm or 300 mm. This way, molded workpiece 210 is a reconstituted wafer 260 consisting of semiconductor chips 2 embedded in a molded material matrix.

Figure 5C:
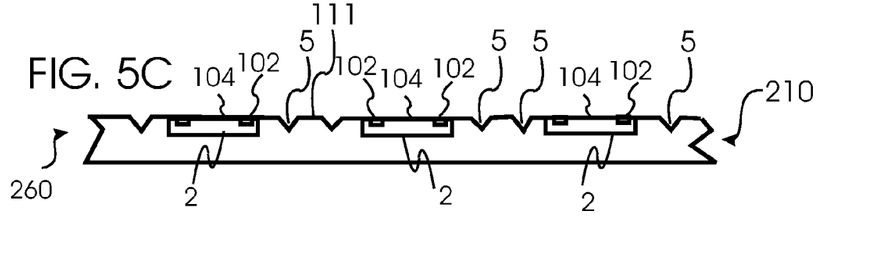

FIG. 5C schematically discloses reconstituted wafer 260 after having been removed from carrier 201, and turned upside down. In the case of the carrier 201 being a thermo-releasable tape, reconstituted wafer 260 may have been removed from carrier 201 by a heating procedure. Like in the previous embodiment, reconstituted wafer 260 consists of the molded material covering semiconductor chips 2 whose first main faces 104 and connection elements 102 are exposed to the outside. Further, the first main faces 104 of the chips and the molded material in between define a coplanar plane 111. The planarity of first main face 111 is solely interrupted by the cone-shaped recesses 5.

Figure 5D:
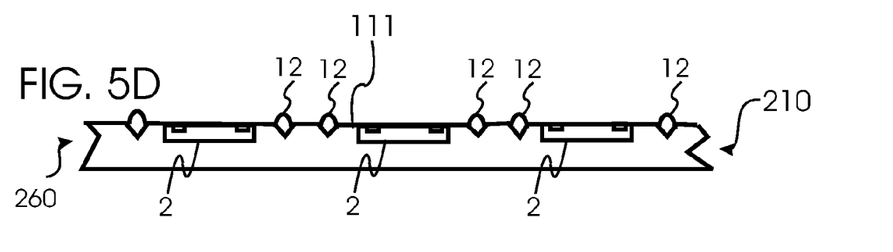

FIG. 5D schematically discloses reconstituted wafer 260 after its recesses 5 having been filled with solder elements 12 that protrude from the first main face 111. The filling of the recesses 5 with solder material can be done in the same way as described in the embodiment of FIG. 4A to 4H. Note that the embodiment of FIGS. 5A-5D usually also comprises a redistribution layer of a type shown in FIGS. 4A-4H, to electrically connect the solder elements 12 with the integrated circuit of the chips 2. However, for the sake of simplicity of the drawing, such redistribution layer is not shown explicitly a second time in FIGS. 5A-5D.

Figure 5E:
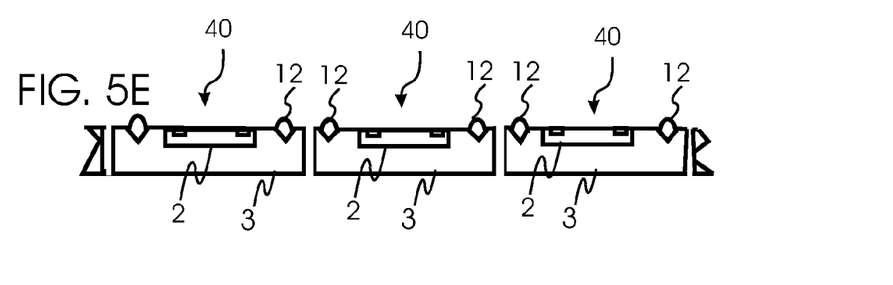

FIG. 5E schematically discloses reconstituted wafer 260 after singulation, by sawing, etching or both, to yield multiple separated semiconductor devices 40. Each of the semiconductor devices 40 is comprised of a chip 2 and a molded body 3 covering the chips on the chip's sides and backside.

FIGS. 6A to 6E schematically disclose a further embodiment of a method of manufacturing semiconductor devices 50. The method is similar to the embodiment of FIGS. 5A to 5E. Accordingly, elements and features having the same reference numbers as the features of the previous figures may refer to similar features.

Different to the embodiment of FIGS. 5A to 5E, carrier 301 of FIGS. 6A-6E comprises an array of conically shaped recesses 307. The conically shaped recesses 307 are to form cone-shaped protrusions 205 in the molded material when applying mold material over the carrier (see FIG. 6B). The carrier with the conically shaped recesses 307 may be part of a mold form in which the semiconductor chips 2 are molded. Like in FIGS. 5A-5E, the chips 2 are placed on the carrier 301 at predetermined distances from each other. Further, likewise, the chips 2 are oriented such that the connection elements 102 face the carrier 301.

Figure 6A:
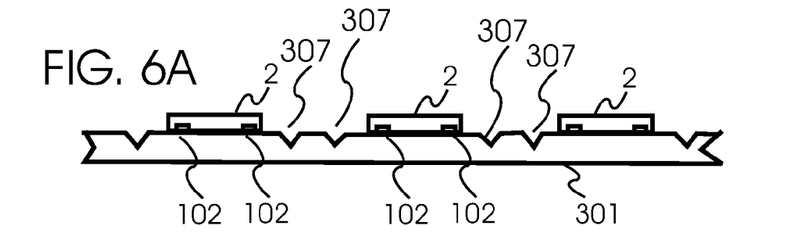
FIGS. 6A to 6E schematically disclose an embodiment of a method of manufacturing semiconductor devices wherein protrusions are formed during the molding of the molded body.
Figure 6B:
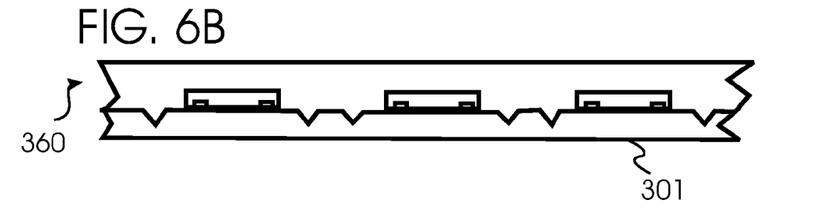

FIG. 6B schematically discloses the semiconductor chips 2 after having been molded to become a reconstituted wafer 360. Like in the previous embodiments, the mold form that forms the reconstituted wafer 360 is provided with a cavity of a semiconductor wafer shape, i.e. a height of typically a few hundred micrometers, and a diameter of, say, 200 mm or 300 mm.

Figure 6C:
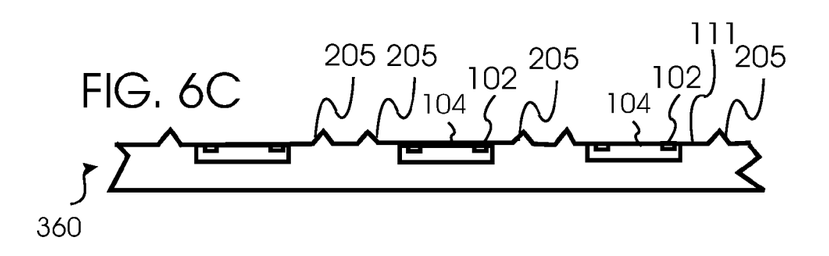

FIG. 6C schematically discloses reconstituted wafer 360 after having been removed from carrier 301 and being turned upside down. Like in the previous embodiments, reconstituted wafer 360 consists of the molded material covering semiconductor chips 2, whose first main faces 104 and connection elements 102 are exposed to the outside. Further, the first main faces 104 of the chips and the molded material in between define a coplanar plane 111. The planarity of first main face 111 is solely interrupted by the cone-shaped protrusions 205.

Figure 6D:
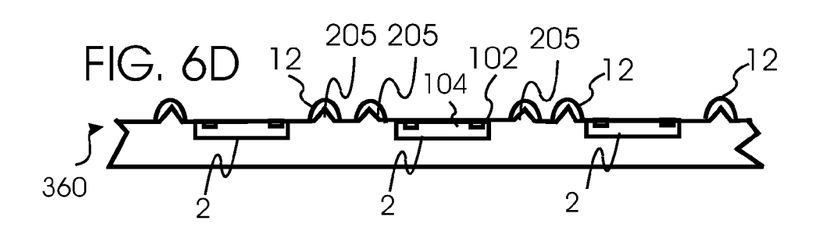

FIG. 6D schematically discloses reconstituted wafer 360 after having covered the cone-shaped protrusions 205 with solder elements 12. As can be seen in the figure, the solder elements 12 are each mechanically engaged with their respective cone-shaped protrusion 205 when pulled in lateral directions. This way, when CTE forces act on the solder elements 12 in lateral direction, the forces can be partially transferred to the cone-shaped protrusions 205 that are part of the molded material. This relieves the strain on the interface region between the solder elements 12 and the molded body 3.

The application of the solder material 12 on the cone-shaped protrusions 205 can be done in a similar way as was described for the filling of solder elements into the recesses. Note that the embodiment of FIGS. 6A-6D may comprises a redistribution layer of a type shown in FIGS. 4A-4H, to electrically connect the solder elements 12 with the integrated circuit of the chips 2. For the sake of simplicity of the drawing, again, such redistribution layer is not shown explicitly a second time in FIGS. 6A-6D.

Figure 6E:
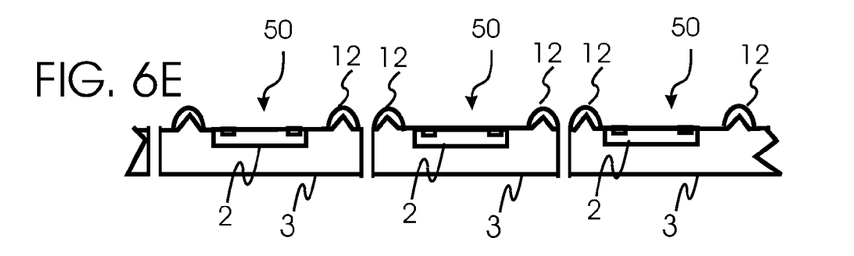

FIG. 6E schematically discloses reconstituted wafer 360 after singulation, by sawing, etching, laser dicing, or a combination thereof, to yield multiple separated semiconductor devices 50. Each of the semiconductor devices 50 is comprised of a chip 2 and a molded body 3 covering the chips on the chip's sides and backside.

Figure 7A:
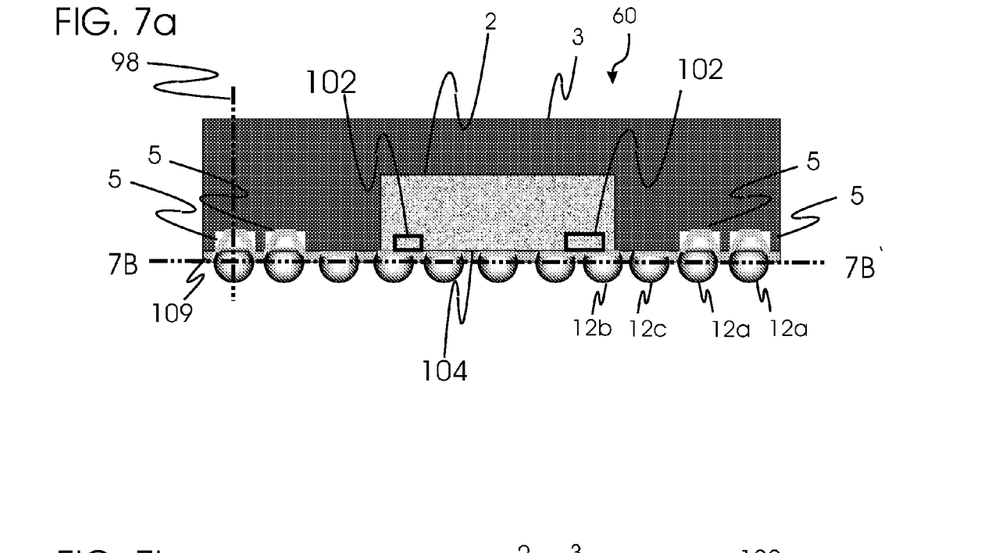
FIGS. 7A and 7B schematically disclose two orthogonal cross sections of an embodiment of a semiconductor device comprising a molded body shaped to comprise an array of recesses in which first solder elements are located, and an array of second solder elements connected to the semiconductor chip.
Figure 7B:
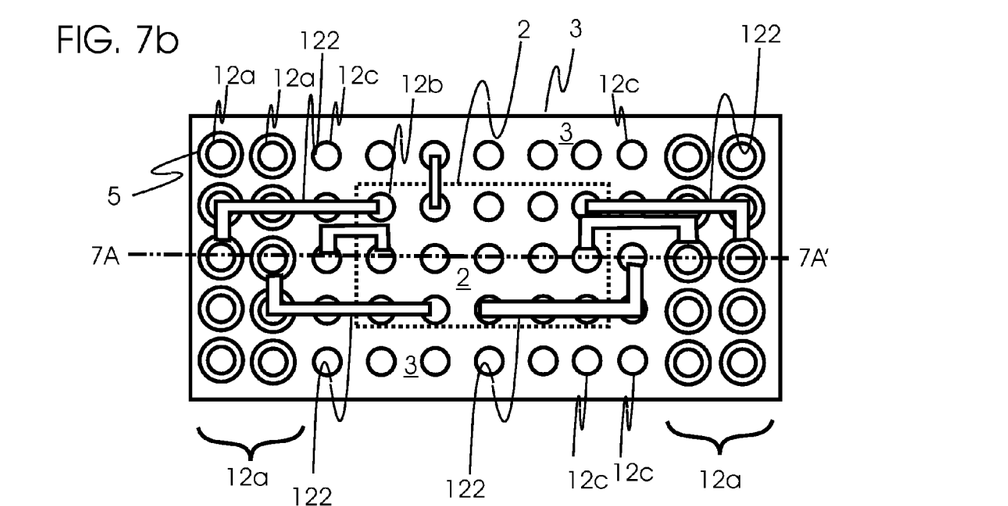

FIGS. 7A and 7B schematically disclose orthogonal cross sections of a further embodiment of a semiconductor device 60 along the lines 7A-7A' and 7B-7B'.

The embodiment of FIGS. 7A-7B is like the one disclosed in FIG. 2A-2B. However, different to FIGS. 2A-2B, first main face 104 of chip 2 is free of molded material. In other words, molded body 3 does not cover the first main face 104 of chip 2.

Further, FIGS. 7A-7B differ over the embodiment of FIGS. 2A-2B in that the embodiment of FIGS. 7A-7B discloses schematically a redistribution layer 109 comprising a structured first conducting layer forming conducting lines 122 that connect the connection elements of chip 2 with the solder elements 12. The conducting lines 122 may have been produced in a way that was described for FIGS. 4F-4H. Note that with the first main face 104 remaining exposed to the outside after the molding step, the redistribution layer 109 can be applied after the molding.

FIGS. 7A-7B further differ over the embodiment of FIGS. 2A-2B in that some of the solder elements 12 are located underneath the chip 2 ("second solder elements 12*b*"), and some underneath molded body 3. Further, of those solder elements 12 that are located underneath molded body 3, some are mechanically engaged with the molded material ("first solder elements 12*a*"), and some are not ("third solder elements 12c"). The mechanical engagement is realized by having the solder elements 12a each fill one of the recesses 5 in the molded body 3, as schematically shown in FIG. 7a.

In this embodiment, only the first solder elements 12a of the outermost two columns of the array of solder elements are engaged with the recesses 5 of molded body 3. Having the outer solder elements 12a engaged with the molded body 3 takes account of the fact that the lateral forces on the solder elements 12 are the bigger the further away the solder elements 12 are located from the central position of the semiconductor device 60.

As can be seen in FIG. 7A-7B, each of the first solder elements 12a and its respective recesses 5 are axially symmetric and coaxially aligned with respect to a solder element axis 98. Further, the solder element axis 98 is essentially orthogonal with respect to the first surface 11 of molded body 3. Further, the first solder elements 12a, the second solder elements 12b and the third solder elements 12c define a common assembly plane 22 for mounting the semiconductor device 60 to a carrier (see FIG. 1A).

Figure 8A:
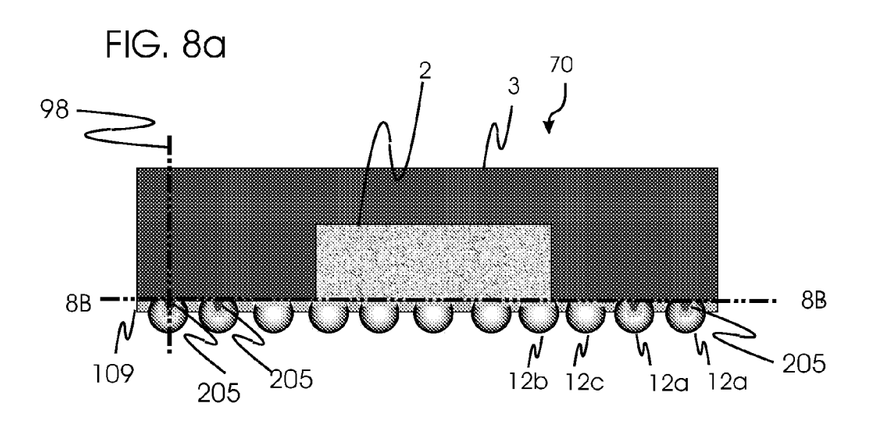
FIGS. 8A and 8B schematically disclose two orthogonal cross sections of an embodiment of a semiconductor device comprising a molded body shaped to comprise an array of protrusions on which first solder elements are located, and an array of second solder elements connected to the semiconductor chip.
Figure 8B:
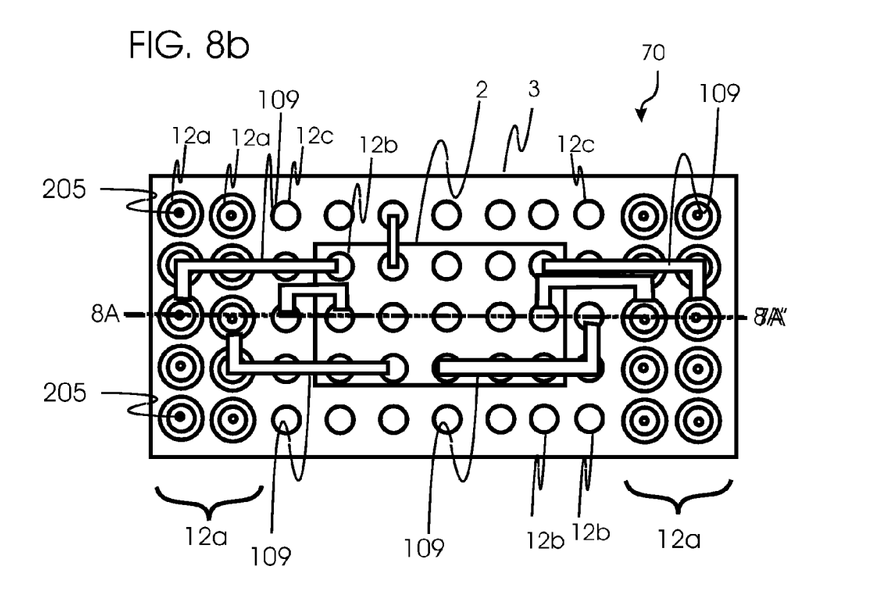

FIGS. 8A and 8B schematically disclose orthogonal cross sections of a further embodiment of a semiconductor device 70 along the lines 8A-8A' and 8B-8B'. The embodiment of FIGS. 8A-8B is similar to the one disclosed in FIG. 7A-7B. However, different to FIGS. 7A-7B, the embodiment of FIGS. 8A-8B comprises protrusions 205 for mechanically engaging the first solder elements 12a with molded body 3. The concept of engaging first solder elements 12a with protrusions 205 of molded body 3 has been described in some detail in the FIGS. 3A-3B, and FIGS. 6A-6E.

Figure 9A:
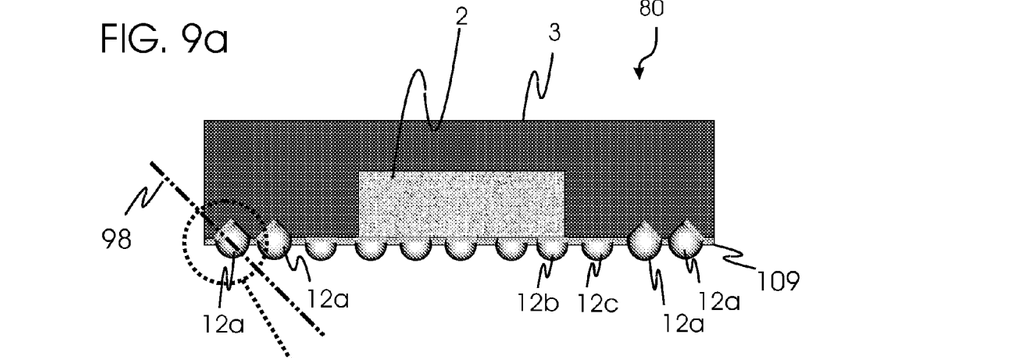
FIG. 9A schematically discloses an embodiment of a semiconductor device comprising a molded body shaped to comprise an array of recesses, wherein the recesses have a tilted solder pads directed towards the center of the semiconductor device, and solder elements placed on the tilted solder pad.
Figure 9B:
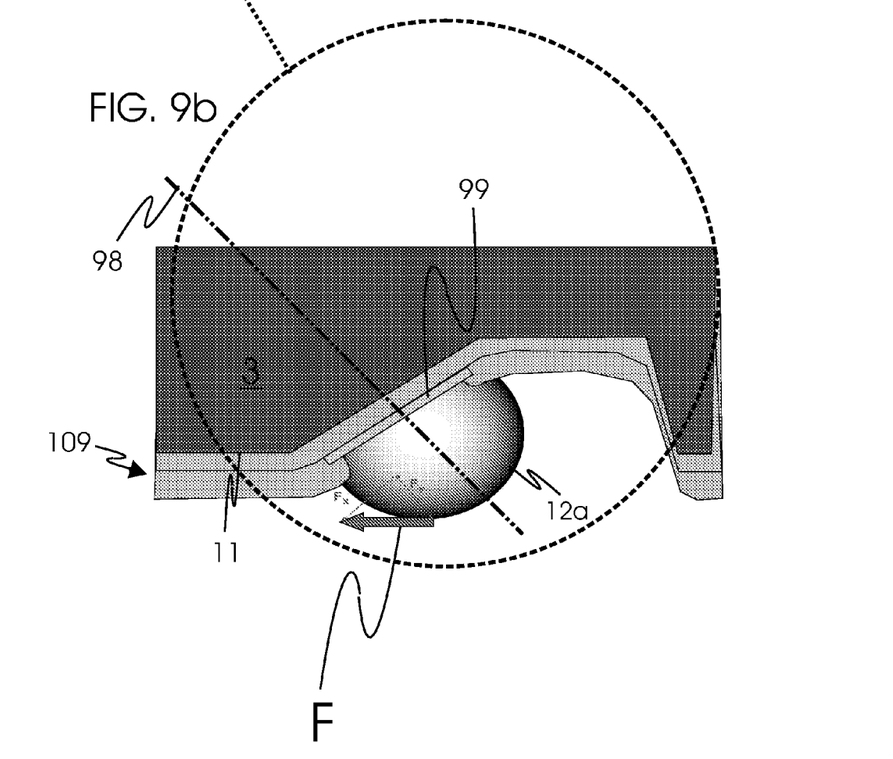
FIG. 9B shows schematically a magnified view on the details of one of such recesses.

FIGS. 9A-9B schematically disclose a further embodiment of a semiconductor device 80. FIG. 9B represents a magnified, more detailed view on the semiconductor device 80 of FIG. 9A in the region of one of the first solder elements 12a.

The embodiment of FIGS. 9A-9B is like the one disclosed in FIG. 7A-7B showing a chip 2 covered by molded body 3, a redistribution layer 109 covering the active area of the semiconductor chip 2 and the molded body 3, and solder elements 12a, 12b, 12c defining an assembly plane for mounting the semiconductor device 80 to a carrier.

However, different to FIGS. 7A-7B, recess 5 is rotationally asymmetric with respect to any axis. Further, as can be seen from FIG. 9B, solder pad 99 covers the inner wall of recess 5 only partially. As a result, solder element 5 fills recess 5 only partially. Further, with solder pad 99 tilted with respect to first surface 11, solder element axis 98 is tilted with respect to an axis orthogonal to the first surface 11 of molded body 3. In this example, the tilting angle is about 45 degrees in a direction that solder pad 99 faces towards the center of the array of solder elements 12a. With such tilt, it is possible to have the solder element 12a be engaged with the molded body 3 with respect to selected lateral forces F. For example, with the fat arrow F in FIG. 9B indicating a lateral force pointing to the left side, due to the tilted solder element axis 98, some fraction of the lateral force is directed towards the molded body 3. This way, the harming shear force acting on the interface between solder element 12a and molded body 3 in a direction parallel to the solder pad 99 is reduced. With a reduced shear force between solder element and molded body 3, the chances of breaking solder element 12 away from the molded body 3 are reduced. Accordingly, the use of a tilted solder element axis 98 may help to increase rigidity of solder ball connections between a carrier and semiconductor device 80 in case of CTE induced lateral forces.

Note that the tilting angle of the solder element axis 98 can be controlled by the angle of the solder pad 99 with respect to the first surface 11 of the molded body 3. The solder pad 99 represents that part of the redistribution layer 109 to which the solder element 12 adheres. Solder pad 99 is usually part of the conducting line that connect the solder elements 12 with the connection elements 102 (not shown in FIG. 9A-9B) of the chip 2.

Figure 10:
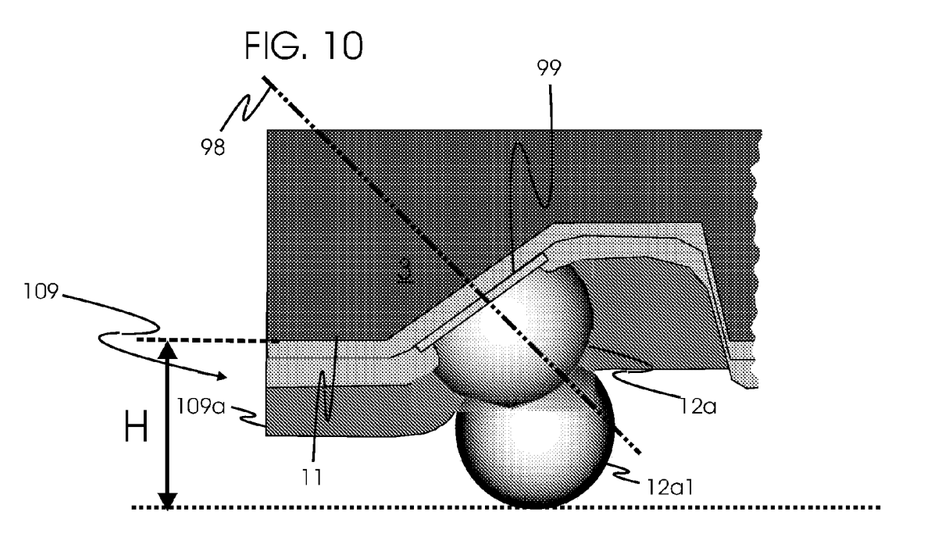
FIG. 10 schematically discloses a portion of an embodiment of a semiconductor device comprising a molded body shaped to comprise an array of recesses, wherein two solder elements are soldered on top of each other.

FIG. 10 discloses a further embodiment of a solder element engaged with a molded body 3 that is similar to the one of FIG. 9B. However, different to FIG. 9B, FIG. 10 discloses a second solder element 12a1 soldered on top of solder element 12a. As a result, the stand-off height H of the molded body 3 to the assembly plane 22, i.e. the distance between molded body 3 and a carrier, is increased. The increased stand-off height H results in a larger flexibility of the solder element connection between the carrier and the molded body. The larger flexibility in turn reduces the chances of the solder elements 12a, 12a1 breaking away from the molded body 3.

Further, different to FIGS. 9A-9B, FIG. 10 discloses a further insulating layer 109a, e.g. a polyimide, applied on top of redistribution layer 109. The openings of the insulating layer 109a layer define the size and location for the second solder element 12a1 on top of first solder element 12a.

What is claimed is:
1. A semiconductor device comprising:
a semiconductor chip having at least one connection element;
a molded body covering the semiconductor chip except over a portion of the semiconductor chip that includes the at least one connection element, the molded body comprising at least one recess located outside a vertical boundary of the semiconductor chip;
a redistribution layer disposed over the molded body including the at least one recess located outside the vertical boundary of the semiconductor chip, the redistribution layer comprises an insulating layer disposed over the molded body, at least one conducting line disposed over the insulating layer for connecting to the semiconductor chip, and a solder stop layer disposed over the insulating layer and the at least one conducting line;
at least one solder element disposed over the at least one recess and a portion of the redistribution layer that are located outside the vertical boundary of the semiconductor chip, and
wherein the redistribution layer is at least one conducting line extending from a first end contacting the at least one solder element along the at least one recess located outside the vertical boundary of the semiconductor chip to a second end contacting the at least one connection element of the semiconductor chip, and the insulating layer and the solder stop layer comprise an opening over the at least one recess for allowing solder material to enter into the at least one recess to form the at least one solder element.

2. The semiconductor device according to claim 1 wherein the at least one solder element is at least one solder bump.

3. The semiconductor device according to claim 1 wherein the at least one solder element is adapted to define a first plane defining an orientation for a carrier to which the semiconductor chip can be mounted.

4. The semiconductor device according to claim 1 further comprising second solder elements that are connected to the semiconductor chip.

5. The semiconductor device according to claim 1 wherein the at least one solder element is are axially symmetric to a first axis tilted with respect to a second axis normal to the first plane.

6. A semiconductor device comprising:
a semiconductor chip having at least one connection element;
a molded body covering the semiconductor chip except over a portion of the semiconductor chip that includes the at least one connection element, the molded body comprising at least one recess located outside a vertical boundary of the semiconductor chip;
a redistribution layer disposed over the molded body including the at least one recess located outside the vertical boundary of the semiconductor chip; and
at least one solder bump placed in the at least one recess of the molded body and engaged with a portion of the redistribution layer, wherein the redistribution layer is at least one conducting line extending from a first end contacting the at least one solder element along the at least one recess located outside the vertical boundary of the semiconductor chip to a second end contacting the at least one connection element of the semiconductor chip.

7. The semiconductor device according to claim 6 wherein the redistribution layer is a first conducting layer over the semiconductor chip and the molded body that electrically connects the semiconductor chip with the at least one bump solder.

8. The semiconductor device according to claim 1 wherein the at least one solder element comprises material selected from at least one of Pb, Sn, Cu, Ag, and Nt.

9. The semiconductor device according to claim 1 wherein the least one conducting line completely covers an inner wall of the at least one recess.

10. The semiconductor device according to claim 1 wherein the at least one conducting line is electrically coupled to the semiconductor chip and the at least one solder element.

11. The semiconductor device according to claim 1 wherein the insulating layer is adapted to selectively insulate the semiconductor chip from the at least one conducting line.

12. The semiconductor device according to claim 1 wherein the solder stop layer is adapted to define at least one position of the at least one solder element.

* * * * *